(12) United States Patent
Kim et al.

(10) Patent No.: US 10,211,271 B2
(45) Date of Patent: Feb. 19, 2019

(54) ORGANIC LIGHT EMITTING DISPLAY DEVICE

(71) Applicant: LG Display Co., Ltd., Seoul (KR)

(72) Inventors: JongSung Kim, Bucheon-si (KR); Ho-Jin Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/828,216

(22) Filed: Nov. 30, 2017

(65) Prior Publication Data
US 2018/0151651 A1    May 31, 2018

(51) Int. Cl.
*H01L 27/32* (2006.01)

(52) U.S. Cl.
CPC ........ *H01L 27/3248* (2013.01); *H01L 27/322* (2013.01); *H01L 27/3211* (2013.01); *H01L 27/3246* (2013.01); *H01L 27/3262* (2013.01)

(58) Field of Classification Search
CPC .......... H01L 27/3262; H01L 27/3246
See application file for complete search history.

(56) References Cited

U.S. PATENT DOCUMENTS

| | | | | |
|---|---|---|---|---|
| 2010/0025675 | A1* | 2/2010 | Yamazaki | H01L 29/66742 257/43 |
| 2016/0322445 | A1* | 11/2016 | Lee | H01L 51/5253 |
| 2016/0372497 | A1* | 12/2016 | Lee | H01L 27/1255 |
| 2017/0062478 | A1* | 3/2017 | Choi | H01L 27/124 |
| 2017/0062542 | A1* | 3/2017 | Jung | H01L 27/3272 |
| 2017/0092894 | A1* | 3/2017 | Yang | H01L 51/5253 |
| 2017/0194415 | A1* | 7/2017 | Choi | H01L 51/0096 |
| 2017/0309688 | A1* | 10/2017 | Lee | G09G 3/3225 |

\* cited by examiner

*Primary Examiner* — Thao P Le
(74) *Attorney, Agent, or Firm* — Seed IP Law Group LLP (57) ABSTRACT

Disclosed is an organic light emitting display device for reducing or preventing anodes from being partially detached or torn in high resolution models. The organic light emitting display device includes a substrate including first and second subpixels disposed adjacent to each other in a first axis direction, a first anode electrode provided in the first subpixel and connected to a first TFT of the first subpixel through a first contact hole, and a second anode electrode provided in the second subpixel and connected to a second TFT of the second subpixel through a second contact hole. The first and second contact holes are disposed in a diagonal direction, the first anode electrode protrudes from the first contact hole in a direction toward the second subpixel, and the second anode electrode protrudes from the second contact hole in a direction toward the first subpixel. Accordingly, partial detachment of anode electrodes is reduced, or in some cases, prevented.

20 Claims, 7 Drawing Sheets

ORGANIC LIGHT EMITTING DISPLAY DEVICE

CROSS-REFERENCE TO RELATED APPLICATIONS

This application claims the benefit of the Korean Patent Application No. 10-2016-0161912 filed on Nov. 30, 2016, which is hereby incorporated by reference as if fully set forth herein.

BACKGROUND

Technical Field

The present disclosure relates to an organic light emitting display device, and particularly, to an organic light emitting display device for a high resolution model.

Description of the Related Art

With the advancement of information-oriented society, various requirements for display devices for displaying an image are increasing. Therefore, various display devices such as liquid crystal display (LCD) devices, plasma display panel (PDP) devices, organic light emitting display devices, etc. are being used recently.

As a type of display device, organic light emitting display devices are self-emitting display devices and are better in viewing angle and contrast ratio than LCD devices. Also, since the organic light emitting display devices do not need a separate backlight, it is possible to lighten and thin the organic light emitting display devices, and the organic light emitting display devices are excellent in power consumption. Furthermore, the organic light emitting display devices are driven with a low direct current (DC) voltage, have a fast response time, and are low in manufacturing cost.

Figure 1:
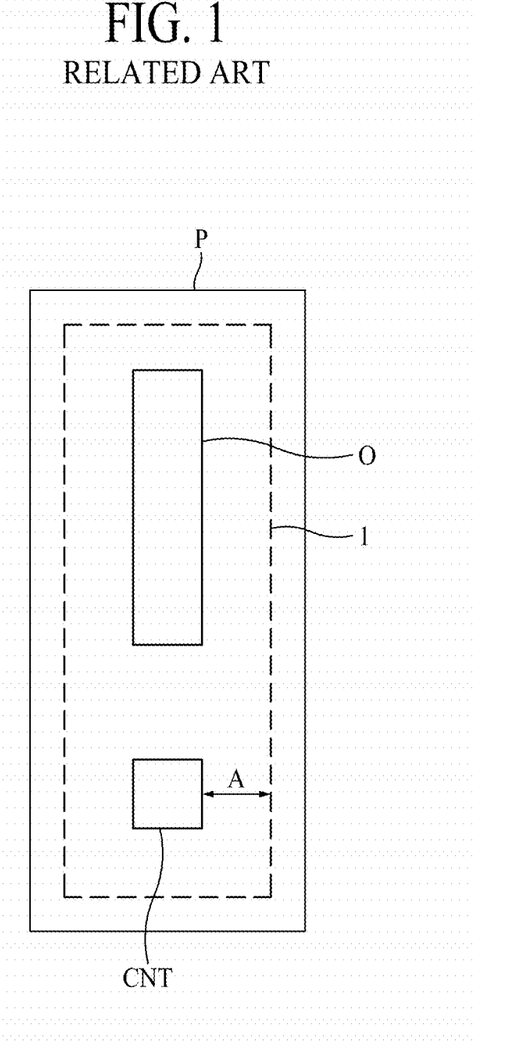
FIG. 1 is a plan view schematically illustrating one subpixel of a related art organic light emitting display device.

FIG. 1 is a plan view schematically illustrating one subpixel of a related art organic light emitting display device.

As seen in FIG. 1, a plurality of subpixels P are provided in an active area on a substrate. In each of the subpixels P, an anode electrode 1 and a thin film transistor (TFT) layer including a source electrode and a drain electrode are provided, and the anode electrode 1 is connected to the TFT layer through a contact hole CNT of a planarization layer provided on the TFT layer.

A bank is provided on the anode electrode 1 to define a pixel, an organic light emitting layer in an opening O is provided in the pixel defined by the bank, and a cathode electrode is provided on the organic light emitting layer. In such a stacked structure, light emitted from the organic light emitting layer passes through the cathode electrode and travels.

Recently, a high resolution model is being researched for displaying a sharp screen. In the high resolution model, an area of each of the subpixels P is reduced, and thus, an area of the anode electrode 1 is reduced. On the other hand, there is a limitation in decreasing an area of the contact hole CNT, and thus, a constant area of the contact hole CNT in each subpixel P is maintained. That is, as a resolution of a model becomes higher like the high resolution model, an area occupied by the anode electrode 1 in one pixel P is reduced, and an area occupied by the contact hole CNT increases.

The related art organic light emitting display device has the following problems.

Figure 2:
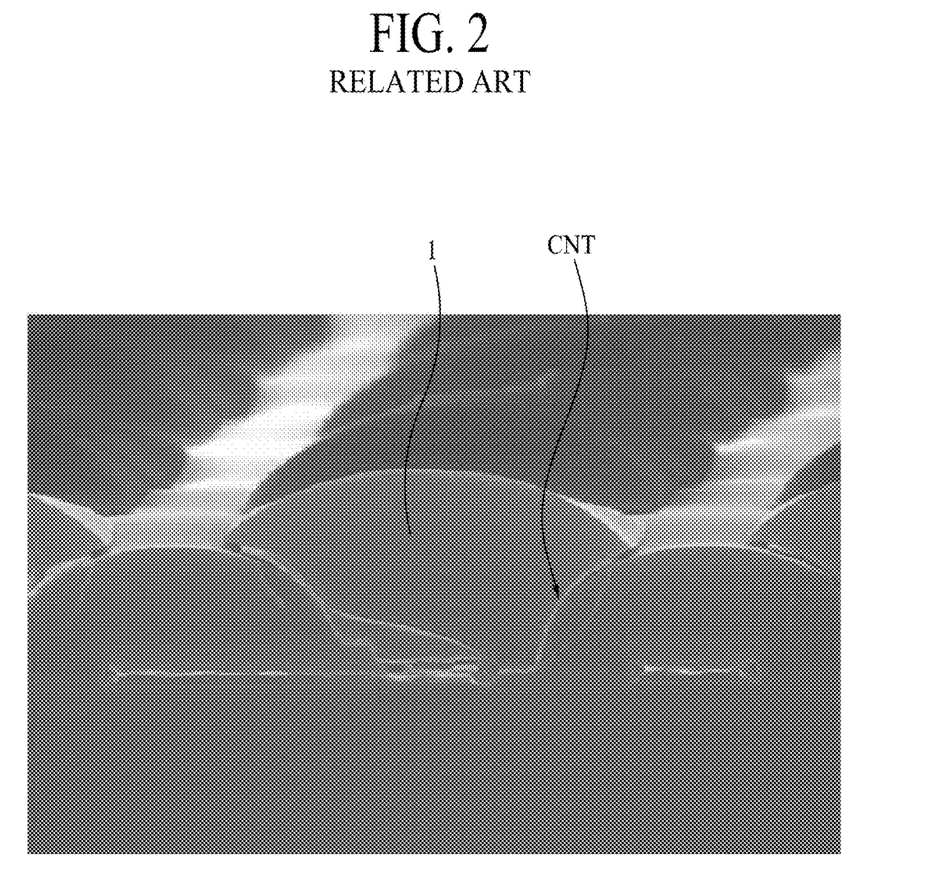
FIG. 2 is a cross-sectional view illustrating in detail a connection state between a TFT and an anode electrode through a contact hole in the organic light emitting display device of FIG. 1.

FIG. 2 is a cross-sectional view illustrating in detail a connection state between a TFT and an anode electrode through a contact hole in the organic light emitting display device of FIG. 1.

As illustrated in FIG. 2, the anode electrode 1 is connected to the TFT through the contact hole CNT in each pixel P, but in the related art organic light emitting display device for realizing a high resolution of 1000 ppi (pixel per inch), as a distance A by which the anode electrode 1 is spaced apart from the contact hole CNT is reduced, the anode electrode 1 is partially detached.

Figure 3:
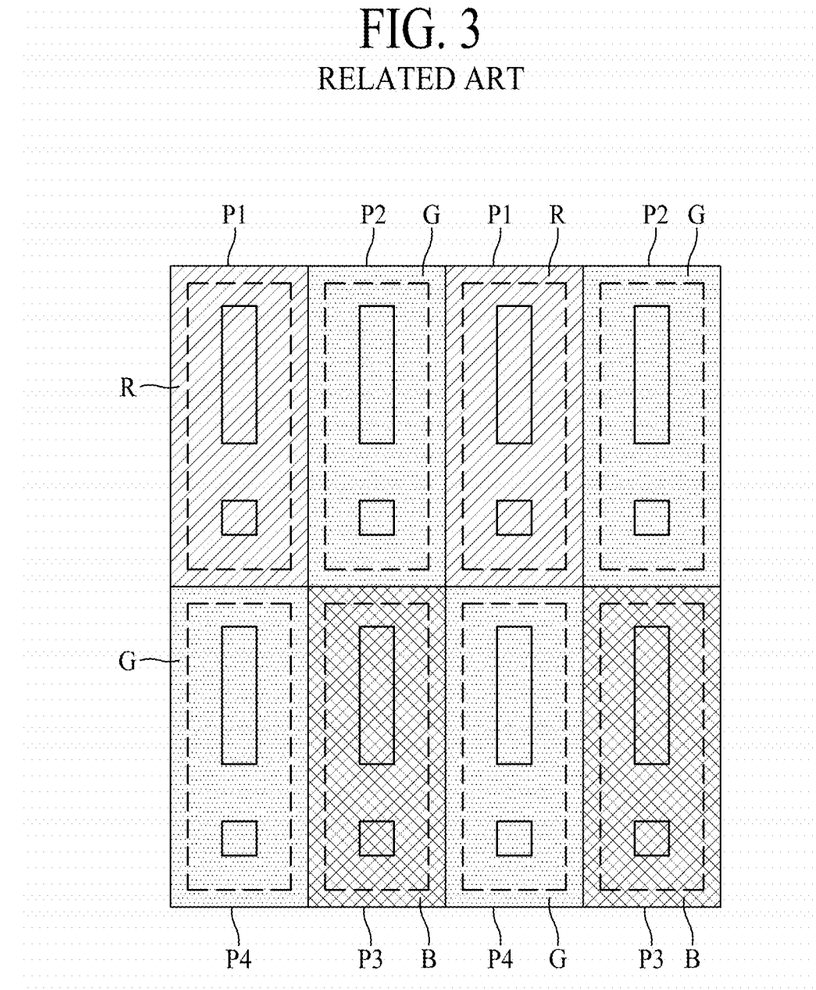
FIG. 3 is a schematic plan view illustrating an arrangement state of subpixels and color filters in a related art high-resolution organic light emitting display device.

FIG. 3 is a schematic plan view illustrating an arrangement state of subpixels and color filters in a related art high-resolution organic light emitting display device.

Moreover, the related art high-resolution organic light emitting display device includes first and second subpixels P1 and P2 which are disposed adjacent to each other in a first direction, a third subpixel P3 which is disposed adjacent to the second subpixel P2 in a second direction vertical to the first direction, and a fourth subpixel P4 which is disposed adjacent to the first subpixel P1 in the second direction. Also, red light is emitted from the first subpixel P1, green light is emitted from each of the second subpixel P2 and the fourth subpixel P4, and blue light is emitted from the third subpixel P3.

That is, as an organic light emitting display device is implemented to have a high resolution, an area of one pixel is reduced, and for this reason, it is impossible that subpixels emitting red light, green light, and blue light are all included in one pixel. In order to solve such a problem, as illustrated in FIG. 3, subpixels are arranged in an RGBG structure.

However, in an organic light emitting display device having the RGBG structure, as illustrated in FIG. 3, since a red color filter R, a green color filter G, and a blue color filter B are arranged in an island type in each subpixel, the color filters are peeled. That is, in a case where subpixels emitting red light, green light, and blue light are arranged in a horizontal direction in one pixel, color filters are provided in a vertical direction in a plurality of pixels and arranged in a stripe type, and thus, the color filters usually do not peel. However, in an organic light emitting display device having the RGBG structure applied to a high resolution model, each of color filters is provided in only one subpixel corresponding thereto, and for this reason, the color filters usually peel.

BRIEF SUMMARY

Accordingly, the present disclosure is directed to provide an organic light emitting display device that substantially obviates one or more problems due to limitations and disadvantages of the related art.

An aspect of the present disclosure is directed to provide an organic light emitting display device which has a pixel structure where an anode electrode is spaced apart from, by a certain distance, a contact hole for connecting the anode electrode to a TFT, thereby solving a problem of the partial detachment of the anode electrode which occurs in a high resolution model.

Another aspect of the present disclosure is directed to provide an organic light emitting display device in which color filters are arranged in a stripe type extending along a plurality of subpixels when a pixel structure of a high resolution model is applied, thereby reducing or preventing the color filters from being peeled.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided an organic light emitting display device including a substrate including a first subpixel and a second subpixel disposed adjacent to each other in a first axis direction, a first anode electrode provided in the first subpixel and connected to a first thin film transistor (TFT) of the first subpixel through a first contact hole, and a second anode electrode provided in the second subpixel and connected to a second TFT of the second subpixel through a second contact hole. The first contact hole and the second contact hole are disposed in a diagonal direction relative to each other. The first anode electrode extends from the first contact hole in a direction toward the second subpixel, and the second anode electrode extends from the second contact hole in a direction toward the first subpixel.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, exemplary embodiments of the present disclosure will be described in detail with reference to the accompanying drawings.

Figure 4:
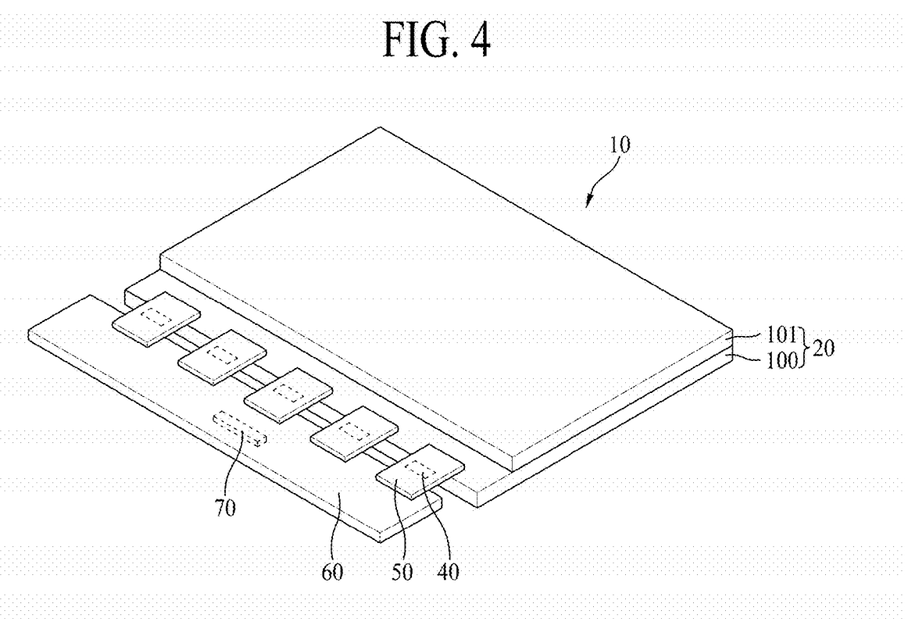
FIG. 4 is a perspective view illustrating an organic light emitting display device according to an embodiment of the present disclosure.

FIG. 4 is a perspective view illustrating an organic light emitting display device 10 according to an embodiment of the present disclosure.

Figure 5:
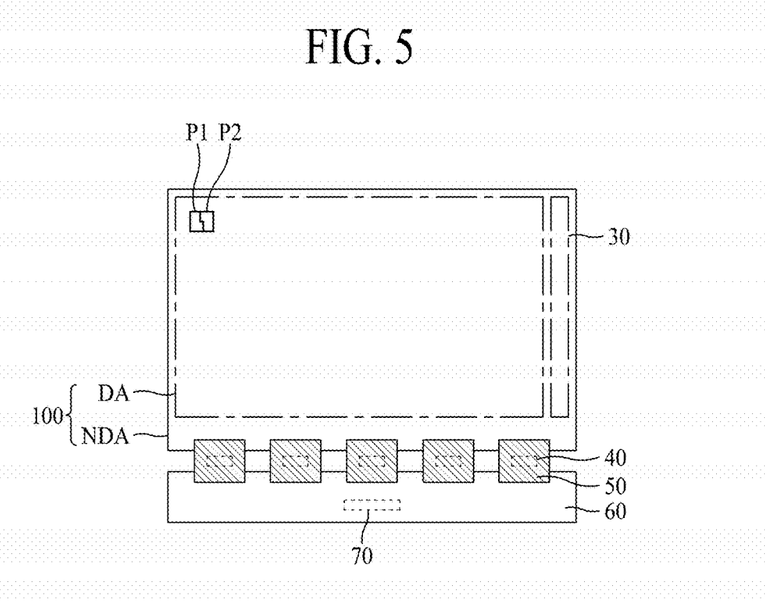
FIG. 5 is a plan view illustrating a substrate, a gate driver, a source drive integrated circuit (IC), a flexible film, a circuit board, and a timing controller of FIG. 4.

FIG. 5 is a plan view illustrating a substrate, a gate driver, a source drive integrated circuit (IC), a flexible film, a circuit board, and a timing controller of FIG. 4.

Referring to FIGS. 4 and 5, the organic light emitting display device 10 according to an embodiment of the present disclosure may include a display panel 20, a gate driver 30, a source drive IC 40, a flexible film 50, a circuit board 60, and a timing controller 70.

The display panel 20 may include a substrate 100 and an encapsulation substrate 101. The substrate 100 may be a plastic film, a glass substrate, or the like. The encapsulation substrate 101 may be a plastic film, a glass substrate, an encapsulation film, or the like.

A plurality of gate lines, a plurality of data lines, and a plurality of pixels may be provided on one surface of the substrate 100 facing the encapsulation substrate 101. The pixels may be respectively provided in a plurality of areas defined by an intersection structure of the gate lines and the date lines and may each include a plurality of subpixels.

Each of the subpixels may include a thin film transistor (TFT) and an organic light emitting device which includes an anode electrode, an organic light emitting layer, and a cathode electrode. When a gate signal is input through a gate line, each of the subpixels may supply a certain current to the organic light emitting device by using the TFT according to a data voltage supplied through a data line. Therefore, the organic light emitting device of each of the subpixels may emit light having certain brightness according to the certain current. A structure of each of the subpixels according to an embodiment of the present disclosure will be described below.

The display panel 20, as illustrated in FIG. 5, may be divided into a display area DA, where the pixels are provided to display an image, and a non-display area NDA which does not display an image. The gate lines, the data lines, and the pixels may be provided in the display area DA. The gate driver 30 and a plurality of pads may be provided in the non-display area NDA.

The gate driver 30 may sequentially supply gate signals to the gate lines according to a gate control signal input from the timing controller 70. The gate driver 30 may be provided in the non-display area NDA outside one side or both sides of the display area DA of the display panel 20 in a gate driver-in panel (GIP) type. Alternatively, the gate driver 30 may be manufactured as a driving chip and may be mounted on a flexible film, and moreover, may be attached on the non-display area NDA outside the one side or the both sides of the display area DA of the display panel 20 in a tape automated bonding (TAB) type.

The source drive IC 40 may receive digital video data and a source control signal from the timing controller 70. The source driver IC 40 may convert the digital video data into analog data voltages according to the source control signal and may respectively supply the analog data voltages to the data lines. If the source drive IC 40 is manufactured as a driving chip, the source drive IC 40 may be mounted on the flexible film 50 in a chip-on film (COF) type or a chip-on plastic (COP) type.

A plurality of pads such as data pads may be provided in the non-display area NDA of the display panel 20. Lines connecting the pads to the source drive IC 40 and lines connecting the pads to lines of the circuit board 60 may be provided on the flexible film 50. The flexible film 50 may be attached on the pads by using an anisotropic conductive film, and thus, the pads may be connected to the lines of the flexible film 50.

The circuit board 60 may be attached on the flexible film 50 which is provided in plurality. A plurality of circuits implemented as driving chips may be mounted on the circuit board 60. For example, the timing controller 70 may be mounted on the circuit board 60. The circuit board 60 may be a printed circuit board (PCB) or a flexible printed circuit board (FPCB).

The timing controller 70 may receive the digital video data and a timing signal from an external system board (not shown) through a cable of the circuit board 60. The timing controller 70 may generate a gate control signal for controlling an operation timing of the gate driver 30 and a source control signal for controlling the source drive IC 40 which is provided in plurality, based on the timing signal. The timing controller 70 may supply the gate control signal to the gate driver 30 and may supply the source control signal to the plurality of source drive ICs 40.

Figure 6:
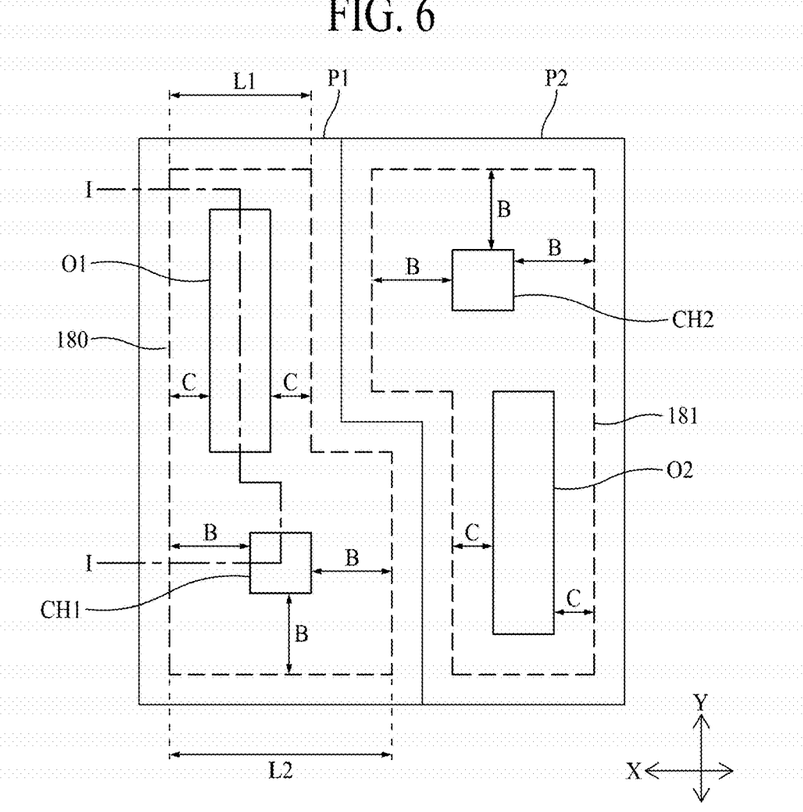
FIG. 6 is a schematic plan view illustrating two adjacent subpixels of an organic light emitting display device according to an embodiment of the present disclosure.

FIG. 6 is a schematic plan view illustrating two adjacent subpixels of an organic light emitting display device according to an embodiment of the present disclosure. In FIG. 6, for convenience of description, only two adjacent pixels are illustrated, but a number of subpixels arranged in a first direction and a second direction vertical to the first direction may be provided in a display area of a substrate.

Referring to FIG. 6, a first TFT (not shown) and a first anode electrode 180 may be provided in a first subpixel P1, and a second TFT (not shown) and a second anode electrode 181 may be provided in a second subpixel P2. The first anode electrode 180 may be connected to the first TFT through a first contact hole CH1, and the second anode electrode 181 may be connected to the second TFT through a second contact hole CH2. A stacked structure of the first subpixel P1 and the second subpixel P2 will be described below in detail.

The first TFT of the first subpixel P1 may supply a data signal, transferred through a data line (not shown), to the first anode electrode 180 in response to a gate signal supplied through a gate line (not shown).

The first anode electrode 180 may be connected to a source electrode (not shown) of the first TFT through the first contact hole CH1 and may be supplied with the data signal from the first TFT.

As illustrated in FIG. 6, the first anode electrode 180 of the organic light emitting display device according to an embodiment of the present disclosure may protrude from the first contact hole CH1 in a direction toward the second subpixel P2. That is, in an embodiment of the present disclosure, the first anode electrode 180 may be provided longer in an area overlapping the first contact hole CH1 without being provided to have the same length with respect to a first axis direction (an X axis direction, shown in FIG. 6), and thus, the first anode electrode 180 secures a distance to the first contact hole CH1, thereby reducing or preventing the partial detachment of the first anode electrode 180.

In detail, the first anode electrode 180 may extend away from the first contact hole CH1 by at least a predetermined first reference distance B (shown in FIG. 6) with respect to the first axis direction (the X axis direction). Also, the first anode electrode 180 may extend away from the first contact hole CH1 by at least the first reference distance B with respect to a second axis direction (a Y axis direction) vertical to the first axis direction (the X axis direction). In this case, the first reference distance may be set as a separation distance to the first contact hole CH1 in order for the first anode electrode 180 not to be partially detached or torn, based on a length of each of the first axis direction (the X axis direction) and the second axis direction (the Y axis direction) of the first anode electrode 180. That is, a separation distance which the first anode electrode 180 extend away from the first contact hole CH1 in order for the first anode electrode 180 not to be partially detached may be adjusted based on the length of each of the first axis direction (the X axis direction) and the second axis direction (the Y axis direction) of the first anode electrode 180, and thus, the separation distance may be reflected. Also, the reference distance B may be set, additionally based on a material of a planarization layer 170 on which the first anode electrode 180 is provided, a taper angle of the first contact hole CH1, a material of the first anode electrode 180, and a process of forming the first anode electrode 180.

As described above, in the organic light emitting display device according to an embodiment of the present disclosure, the first anode electrode 180 may extend away from the first contact hole CH1 by at least the first reference distance B with respect to the first axis direction (the X axis direction) and the second axis direction (the Y axis direction), thereby solving a problem where the anode electrode 1 is partially detached as the distance between the anode electrode 1 and the contact hole CNT is reduced, as in the related art organic light emitting display device of FIG. 1.

The second TFT of the second subpixel P2 may supply a data signal, transferred through a data line (not shown), to the second anode electrode 181 in response to a gate signal supplied through a gate line (not shown).

The second anode electrode 181 may be connected to a source electrode (not shown) of the second TFT through the second contact hole CH2 and may be supplied with the data signal from the second TFT.

As illustrated in FIG. 6, the second anode electrode 181 of the organic light emitting display device according to an embodiment of the present disclosure may protrude from the second contact hole CH2 in a direction toward the first subpixel P1. That is, in an embodiment of the present disclosure, the second anode electrode 181 may be provided longer in an area overlapping the second contact hole CH2 without being provided to have the same length with respect to the first axis direction (the X axis direction), adjacent to the opening O2. Thus, the second anode electrode 181 extends a distance to the second contact hole CH2, thereby reducing or preventing the partial detachment of the second anode electrode 181.

In detail, the second anode electrode 181 may extend away from the second contact hole CH2 by at least the first reference distance B with respect to the first axis direction (the X axis direction). Also, the second anode electrode 181 may extend away from the second contact hole CH2 by at least the first reference distance B with respect to the second axis direction (the Y axis direction). In this case, the first reference distance B may be set as a separation distance to the second contact hole CH2 in order for the second anode electrode 181 not to be partially detached or torn, based on the length of each of the first axis direction (the X axis direction) and the second axis direction (the Y axis direction) of the second anode electrode 181. That is, a separation distance by which the second anode electrode 181 is spaced apart from the second contact hole CH2 in order for the second anode electrode 181 not to be partially detached may be adjusted based on the length of each of the first axis direction (the X axis direction) and the second axis direction (the Y axis direction) of the second anode electrode 181, and thus, the separation distance may be reflected. Also, the first reference distance B may be set, additionally based on a material of a planarization layer on which the second anode electrode 181 is provided, a taper angle of the second contact hole CH2, a material of the second anode electrode 181, and a process of forming the second anode electrode 181.

As described above, in the organic light emitting display device according to an embodiment of the present disclosure, the second anode electrode 181 may extend away from the second contact hole CH2 by at least the first reference distance B with respect to the first axis direction (the X axis direction) and the second axis direction (the Y axis direction), thereby solving a problem where the anode electrode 1 is partially detached as the distance between the anode electrode 1 and the contact hole CNT is reduced, as in the related art organic light emitting display device of FIG. 1.

Hereinabove, the first subpixel P1 and the second subpixel P2 have been described as being disposed adjacent to each other in the first axis direction (the X axis direction), but the present embodiment is not limited thereto. That is, the first subpixel P1 and the second subpixel P2 may be disposed adjacent to each other in the second axis direction (the Y axis direction), and even in this case, the first anode electrode 180 may be provided to protrude from the first contact hole CH1 in a direction toward the second subpixel P2, and the second anode electrode 181 may be provided to protrude from the second contact hole CH2 in a direction toward the first subpixel P1, thereby reducing or preventing the partial detachment of the first anode electrode 180 and the second anode electrode 181. Also, the first axis direction (the X axis direction) may be opposite to the second axis direction (the Y axis direction), and in this case, the first axis direction may represent the Y axis direction, and the second axis direction may represent the X axis direction.

The first contact hole CH1 and the second contact hole CH2 may be disposed in a diagonal direction D1 relative to each other, and a distance by which the first anode electrode 180 of the first subpixel P1 extends away from the first contact hole CH1 may be almost the same as a distance by which the second anode electrode 181 of the second subpixel P2 extends away from the second contact hole CH2. That is, a length by which the first anode electrode 180 protrudes in a direction toward the second subpixel P2 may be the same as a length by which the second anode electrode 181 protrudes in a direction toward the first subpixel P1. Also, as illustrated in FIG. 6, an area of the second anode electrode 181 is reduced in a region where the first anode electrode 180 protrudes in the direction toward the second subpixel P2, and an area of the first anode electrode 180 is reduced in a region where the second anode electrode 181 protrudes in the direction toward the first subpixel P1.

In addition, the first contact hole CH1 and the first opening O1 may be disposed in a diagonal direction D2 relative to each other.

It is to be noted that in one embodiment, the first contact hole CH1 is positioned in a diagonal direction relative to both the second contact hold CH2 and the first opening O1. The same diagonal relationship can be provided for CH2 relative to both CH1 and O2. In another embodiment, the first contact hole CH1 is positioned in a diagonal direction relative to the second contact CH2 only but not relative to the first opening O1. The same sole diagonal relationship can be provided for CH2 relative to just CH1. In another embodiment, the first contact hole CH1 is positioned in a diagonal direction relative to the first opening O1 only but not relative to CH2. The same sole diagonal relationship can be provided for CH2 relative to just O2.

Therefore, in the organic light emitting display device according to an embodiment of the present disclosure, the first contact hole CH1 and the second contact hole CH2 may be disposed in a diagonal direction, and the first anode electrode 180 and the second anode electrode 181 may be respectively extends away from the first contact hole CH1 and the second contact hole CH2 by the first reference distance, thereby reducing or fully preventing the partial detachment of the first anode electrode 180 and the second anode electrode 181 without affecting a total area of the first and second subpixels P1 and P2. That is, in a case where the anode electrode 1 extends away from the contact hole CNT by the first reference distance with the contact hole being disposed as in the related art organic light emitting display device of FIG. 1, a total area of subpixels increases. On the other hand, in an embodiment of the present disclosure, the first contact hole CH1 and the second contact hole CH2 may be disposed in the diagonal direction, and an area of a region other than a region where the first anode electrode 180 and the second anode electrode 181 protrudes may be reduced by an area of the region where the first anode electrode 180 and the second anode electrode 181 protrudes, thereby maintaining a constant total area of the first and second subpixels P1 and P2.

In more detail, since the first anode electrode 180 protrudes in the direction toward the second subpixel P2 in a region overlapping the first contact hole CH1, a longest region in the first axis direction (the X axis direction) may have a second length L2 which is longer than an anode electrode of the related art, and since the second anode electrode 181 of the second subpixel P2 protrudes in the direction toward the first subpixel P1 in a region which does not overlap the first contact hole CH1, a shortest region in the first axis direction (the X axis direction) may have a first length L1 which is shorter than an anode electrode of the related art. Also, a sum of the lengths L1 and L2 may be two times a length of the related art anode electrode in the first axis direction, so that a constant total area of the subpixels P1 and P2 is maintained. As described above, in an embodiment of the present disclosure, only a structure of each of the anode electrodes 180 and 181 may be changed without any change in total area of each of the first and second subpixels P1 and P2, thereby reducing or fully preventing the partial detachment of the anode electrodes 180 and 181.

Moreover, the first subpixel P1 may include a first bank (not shown) which is provided on each of one side and the other side of the first anode electrode 180 and exposes an upper surface of the first anode electrode 180 to form a first opening area O1, and the second subpixel P2 may include a second bank (not shown) which is provided on each of one side and the other side of the second anode electrode 181 and exposes an upper surface of the second anode electrode 181 to form a second opening area O2. Hereinabove, for convenience of description, the first bank and the second bank have been described as separate elements, but are not limited thereto. In other embodiments, a bank may be provided as a single element without being separately provided in each subpixel and may be provided to extend in each subpixel. An organic light emitting layer (not shown) and a cathode electrode (not shown) may be sequentially stacked in the first opening area O1 and the second opening area O2, and thus, each of the subpixels P1 and P2 may emit light having a predetermined color.

As illustrated in FIG. 6, the first anode electrode 180 may extend away from the first opening area O1 by a predetermined second reference distance C, and the second anode electrode 181 may extend away from the second opening area O2 by the predetermined second reference distance C. Each of the first opening area O1 and the second opening area O2 may denote an area exposed by the bank. Therefore, a region where the first anode electrode 180 and the second anode electrode 181 extends away from the first opening area O1 and the second opening area O2 may denote a region where the bank is provided on the first anode electrode 180 and the second anode electrode 181. In this case, the second reference distance C may be set shorter than the first reference distance B.

That is, the first reference distance B should be set to a value which sufficiently extends away from the first contact hole CH1 and the second contact hole CH2 in order for the first anode electrode 180 and the second anode electrode 181 not to be partially detached, but since the first bank and the second bank extend to an upper surface of the first anode electrode 180 and an upper surface of the second anode electrode 181 so as to expose a portion of the first anode electrode 180 and a portion of the second anode electrode 181, the second reference distance C may be set shorter than the first reference distance B.

Therefore, the first anode electrode 180 may be provided to protrude in a direction toward the second opening area O2 of the second subpixel P2 and the second anode electrode 181 may be provided to protrude in a direction toward the first opening area O1 of the first subpixel P1, but by decreasing the second reference distance C, an area of the first opening area O1 and an area of the second opening area O2 are not affected. In detail, the first anode electrode 180 and the second anode electrode 181 may respectively extends away from the first contact hole CH1 and the second contact hole CH2 by the first reference distance B, and thus, an area where the first anode electrode 180 and the second anode electrode 181 are provided is reduced in the other region where the first opening area O1 and the second opening area O2 are provided. However, in an embodiment of the present disclosure, the first bank and the second bank decrease a region overlapping the first anode electrode 180 and a region overlapping the second anode electrode 181, and thus, an area of each of the first opening area O1 and the second opening area O2 is maintained as-is.

It is possible, in one embodiment, to have first anode electrode 180 overlap second anode electrode 181 in the X direction.

As described above, in the organic light emitting display device according to an embodiment of the present disclosure, the partial detachment of the first anode electrode 180 and the second anode electrode 181 is prevented without affecting an aperture ratio of each of the first and second subpixels P1 and P2.

As illustrated in FIG. 6, the first anode electrode 180 of the first subpixel P1 and the second anode electrode 181 of the second subpixel P2 may have a point symmetric type therebetween. That is, when the first anode electrode 180 is rotated by 180 degrees with respect to a center of a tetragonal shape including the first and second subpixels P1 and P2, the first anode electrode 180 may fully overlap the second anode electrode 181, and when the second anode electrode 181 is rotated by 180 degrees with respect to the center of the tetragonal shape including the first and second subpixels P1 and P2, the second anode electrode 181 may fully overlap the first anode electrode 180. That is, the first anode electrode 180 and the second anode electrode 181 may be provided to have the same area.

Particularly, in each of the first anode electrode 180 and the second anode electrode 181, the first length L2 of the longest region may be 1.4 or less times the second length L1 of the shortest region with respect to the first axis direction (the X axis direction).

That is, as described above, in an embodiment of the present disclosure, in order not to affect a total area of each of the subpixels P1 and P2, a length by which the first anode electrode 180 and the second anode electrode 181 are provided in the first axis direction (the X axis direction) may further increase than the related art in a region where the first contact hole CH1 and the second contact hole CH2 are provided, and a length by which the first anode electrode 180 and the second anode electrode 181 are provided in the first axis direction (the X axis direction) may decrease by the increased length in a region where the first opening area O1 and the second opening area O2 are provided, in comparison with the related art.

As a result, as the first reference distance B by which the first anode electrode 180 and the second anode electrode 181 extends away from the first contact hole CH1 and the second contact hole CH2 increases, a problem where the first anode electrode 180 and the second anode electrode 181 are partially detached can be stably solved, but it is not easy to maintain an area of each of the first opening area O1 and the second opening area O2 which are respectively provided in the first anode electrode 180 and the second anode electrode 181.

In detail, in an organic light emitting display device for a high resolution model, when the first length L2 of the longest region of each of the first anode electrode 180 and the second anode electrode 181 is more than 1.4 times the second length L1 of the shortest region with respect to the first axis direction (the X axis direction), an aperture ratio is reduced. Therefore, in an embodiment of the present disclosure, the first anode electrode 180 and the second anode electrode 181 may be provided so that the first length L2 of the longest region does not exceed 1.4 times the second length L1 of the shortest region with respect to the first axis direction (the X axis direction), and thus, the partial detachment of the first anode electrode 180 and the second anode electrode 181 is prevented in a range which does not affect an aperture ratio of each of the first anode electrode 180 and the second anode electrode 181.

Figure 7:
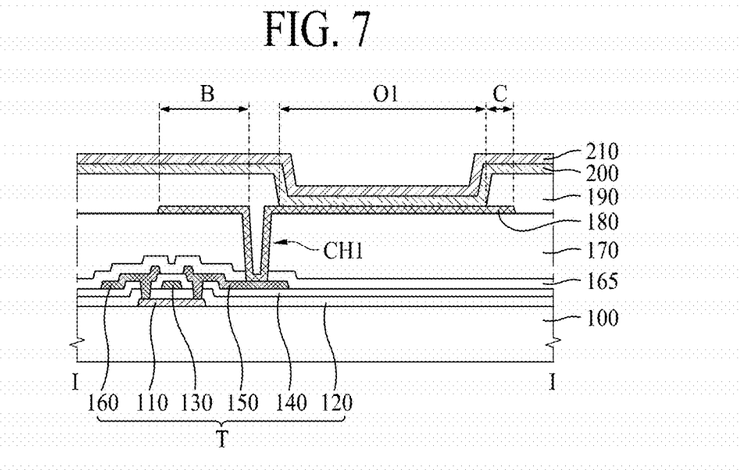
FIG. 7 is a cross-sectional view taken along line I-I of FIG. 6 in the organic light emitting display device according to an embodiment of the present disclosure.

FIG. 7 is a cross-sectional view taken along line I-I of FIG. 6 in the organic light emitting display device according to an embodiment of the present disclosure.

As illustrated in FIG. 7, the first subpixel P 1 of the organic light emitting display device according to an embodiment of the present disclosure may include a first TFT layer T, a passivation layer 165, a planarization layer 170, an anode electrode 180, a bank 190, an organic light emitting layer 200, and a cathode electrode 210 which are provided on a substrate 100.

The first TFT layer T may include an active layer 110, a gate insulation layer 120, a gate electrode 130, an interlayer dielectric 140, a source electrode 150, and a drain electrode 160.

The active layer 110 may be formed on the substrate 100 to overlap the gate electrode 130. The active layer 110 may be formed of a silicon-based semiconductor material, or may be formed of an oxide-based semiconductor material. Although not shown, a light blocking layer may be further formed between the substrate 100 and the active layer 110, and in this case, external light incident through a bottom of the substrate 100 may be blocked by the light blocking layer, thereby reducing or preventing the active layer 110 from being damaged by the external light.

The gate insulation layer 120 may be formed on the active layer 110. The gate insulation layer 120 may insulate the active layer 110 from the gate electrode 130. The gate insulation layer 120 may be formed of an inorganic insulating material, for example, silicon oxide (SiOx), silicon nitride (SiNx), or a multilayer thereof, but is not limited thereto. The gate insulation layer 120 may extend to the second subpixel P2 of FIG. 6.

The gate electrode 130 may be formed on the gate insulation layer 120. The gate electrode 130 may be formed to overlap the active layer 110 with the gate insulation layer 120 therebetween. The gate electrode 130 may be formed of a single layer or a multilayer which includes one of molybdenum (Mo), aluminum (Al), chromium (Cr), gold (Au), titanium (Ti), nickel (Ni), neodymium (Nd), and copper (Cu), or an alloy thereof, but is not limited thereto.

The interlayer dielectric 140 may be formed on the gate electrode 130. The interlayer dielectric 140 may be formed of an inorganic insulating material (for example, silicon oxide (SiOx), silicon nitride (SiNx), or a multilayer thereof) which is the same as that of the gate insulation layer 120, but is not limited thereto. The interlayer dielectric 140 may extend to the second subpixel P2 of FIG. 6.

The source electrode 150 and the drain electrode 160 may be formed on the interlayer dielectric 140 to face each other. The gate insulation layer 120 and the interlayer dielectric 140 may include a contact hole, exposing one area of the active layer 110, and another contact hole which exposes the other area of the active layer 110. Accordingly, the source electrode 150 may be connected to the other area of the active layer 110 through the other contact hole, and the drain electrode 160 may be connected to the one area of the active layer 110 through the contact hole.

In FIG. 7, the source electrode 150 and the drain electrode 160 are illustrated as a single layer, but are not limited thereto.

For example, the source electrode 150 may include a bottom source electrode (not shown) and a top source electrode (not shown), and the bottom source electrode may be formed between the interlayer dielectric 140 and the top source electrode to enhance an adhesive force between the interlayer dielectric 140 and the top source electrode. Also, the bottom source electrode may protect a lower surface of the top source electrode, thereby reducing or preventing the lower surface of the top source electrode from being corroded. Therefore, an oxidation rate of the bottom source electrode may be lower than that of the top source electrode. That is, a material of the bottom source electrode may be a material having a corrosion resistance which is stronger than that of a material of the top source electrode. As described above, the bottom source electrode may act as an adhesion promotor or an anti-corrosion layer and may be formed of an alloy (MoTi) of molybdenum (Mo) and titanium (Ti), but is not limited thereto.

Moreover, the top source electrode may be formed on an upper surface of the bottom source electrode. The top source electrode may be formed of copper (Cu) which is metal having a low resistance, but is not limited thereto. The top source electrode may be formed of metal having a resistance which is relatively lower than that of the bottom source electrode. In order to decrease a total resistance of the source electrode 150, a thickness of the top source electrode may be set thicker than that of the bottom source electrode.

Similarly to the source electrode 150, the drain electrode 160 may also include a bottom drain electrode (not shown) and a top drain electrode (not shown). However, the present embodiment is not limited thereto. In other embodiments, the source electrode 150 and the drain electrode 160 may each be formed of a multilayer including more layers than those of a triple layer.

A structure of the first TFT layer T is not limited to a structure shown in the drawing, and may be variously modified into a structure known to those skilled in the art. For example, in the drawing, the first TFT layer T is illustrated as having a top gate structure where the gate electrode 130 is provided on the active layer 110, but is not limited thereto. In other embodiments, the first TFT layer T may be formed in a bottom gate structure where the gate electrode 130 is provided under the active layer 110.

The passivation layer 165 may be formed on the first TFT layer T, and in more detail, may be formed on an upper surface of each of the source electrode 150 and the drain electrode 160. The passivation layer 165 may protect the first TFT layer T and may be formed of an inorganic insulating material, for example, silicon oxide (SiOx), silicon nitride (SiNx), or a multilayer thereof, but is not limited thereto. The passivation layer 165 may extend to the second subpixel P2 of FIG. 6.

The planarization layer 170 may be formed on the passivation layer 165. The planarization layer 170 may planarize an upper surface of the substrate 100 on which the first TFT layer T is provided. The passivation layer 170 may be formed of an organic insulating material such as acryl resin, epoxy resin, phenolic resin, polyamide resin, polyimide resin, and/or the like, but is not limited thereto. The planarization layer 170 may extend to the second subpixel P2 of FIG. 6.

The first anode electrode 180 may be formed on the planarization layer 170. The passivation layer 165 and the planarization layer 170 may include a first contact hole CH1 which exposes the source electrode 150, and the source electrode 150 may be connected to the first anode electrode 180 through the first contract hole CH1.

As illustrated in FIG. 7, the first anode electrode 180 according to an embodiment of the present disclosure may extend away from the first contact hole CH1 by the predetermined first reference distance B. That is, in the high resolution model, an area of each of the subpixels P1 and P2 is reduced, and thus, an area of the first anode electrode 180 is reduced. However, in the high resolution model, since there is a limitation in reducing an area of the first contact hole CH1, an edge of the first anode electrode 180 is disposed at a position close to the first contact hole CH1, and for this reason, the first anode electrode 180 is partially detached.

Therefore, in an embodiment of the present disclosure, as illustrated in FIG. 6, a shape of the first anode electrode 180 may be modified, and thus, even in the high resolution model, a distance by which the first anode electrode 180 extends away from the first contact hole CH1 is sufficiently maintained, thereby reducing or preventing the partial detachment of the first anode electrode 180.

In FIG. 7, the first anode electrode 180 is illustrated as a single layer, but is not limited thereto.

For example, the first anode electrode 180 may include a first bottom anode electrode (not shown), a first top anode electrode (not shown), and a first cover anode electrode (not shown). The first bottom anode electrode may be provided between the planarization layer 170 and the first top anode electrode to increase an adhesive force between the planarization layer 170 and the first top anode electrode. The first top anode electrode may be provided between the first bottom anode electrode and the first cover anode electrode. The first top anode electrode may be formed of metal having a resistance which is relatively lower than that of each of the first bottom anode electrode and the first cover anode electrode. In order to decrease a total resistance of the first anode electrode 180, a thickness of the first top anode electrode may be set thicker than that of each of the first bottom anode electrode and the first cover anode electrode. The first cover anode electrode may be provided on the first top anode electrode. The first cover anode electrode may be provided to cover an upper surface and a side surface of the first top anode electrode, thereby reducing or preventing the first top anode electrode from being corroded. Accordingly, an oxidation rate of the first cover anode electrode may be lower than that of the first top anode electrode. That is, the first cover anode electrode may be formed of a material having a corrosion resistance which is stronger than that of a material of the first top anode electrode.

However, the present embodiment is not limited thereto. In other embodiments, the first anode electrode 180 may be formed of a double layer or a multilayer including more layers than those of a quadruple layer.

The bank 190 may be formed on the first anode electrode 180.

The bank 190 may be provided on each of one side and the other side of the first anode electrode 180 to expose an upper surface of the first anode electrode 180, thereby forming a first opening area O1 in the first anode electrode 180. Since the bank 190 is provided to expose the upper surface of the first anode electrode 180, an area on which an image is displayed is secured. Also, since the bank 190 is provided on each of the one side and the other side of the first anode electrode 180, a side surface of the first anode electrode 180 vulnerable to corrosion is not exposed to the outside, thereby reducing or preventing the side surface of the first anode electrode 180 from being corroded. Also, the bank 190 may be provided between the first anode electrode 180 and the second anode electrode 181 of the second subpixel P2 to insulate the first anode electrode 180 from the second anode electrode 181.

The bank 190 may be provided on each of the one side and the other side of the first anode electrode 180 so that the first anode electrode 180 is extends away from the first opening area O1 by the predetermined second reference distance C. In this case, the second reference distance C may be set shorter than the first reference distance B.

That is, when the bank 190 is provided on an upper surface of each of the one side and the other side of the first anode electrode 180, the side surface of the first anode electrode 180 is sufficiently prevented from being corroded, and thus, the second reference distance C by which the first anode electrode 180 is extends away from the first opening area O1 may be set shorter than the first reference distance B.

The organic light emitting layer 200 may be provided on the first anode electrode 180. The organic light emitting layer 200 may include a hole injecting layer, a hole transporting layer, a light emitting layer, an electron transporting layer, and an electron injecting layer. A structure of the organic light emitting layer 200 may be modified into a structure known to those skilled in the art. The organic light emitting layer 200 may extend to an upper surface of the bank 190.

The cathode electrode 210 may be provided on the organic light emitting layer 200. Since the cathode electrode 210 is provided on a surface through which light is output, the cathode electrode 210 may be formed of a transparent conductive material. In a case where the organic light emitting display device according to an embodiment of the present disclosure is implemented as a top emission type, since the cathode electrode 210 is formed of a transparent conductive material, a resistance is high, and thus, in order to decrease the resistance of the cathode electrode 210, an auxiliary electrode (not shown) connected to the cathode electrode 210 may be further provided.

Moreover, as illustrated in FIG. 6, the second subpixel P2 of the substrate 100 of the organic light emitting display device according to an embodiment of the present disclosure may be disposed as a point symmetric type with the first subpixel P1, and moreover, may be provided in a stacked structure which is the same as that of the first subpixel P1. Thus, a description of the stacked structure of the second subpixel P2 is omitted.

Although not shown, an encapsulation layer may be additionally provided on the cathode electrode 210 to prevent penetration of water. The encapsulation layer may use various materials known to those skilled in the art. Also, although not shown, a color filter may be further provided on the cathode electrode 210 for each of the subpixels P1 and P2, and in this case, the organic light emitting layer 200 may emit white light.

However, as described above with reference to FIG. 3, in the related art high-resolution organic light emitting display device, due to the reduction in pixel area, it is impossible for one pixel to include all subpixels for emitting red light, green light, and blue light, and thus, subpixels are arranged in an RGBG structure. However, in the RGBG structure, since a red color filter, a green color filter, and a blue color filter are arranged as an island type in each subpixel, the color filters are peeled.

Hereinafter, a structure of an organic light emitting display device according to an embodiment of the present disclosure for solving the problem will be described in detail.

Figure 8A:
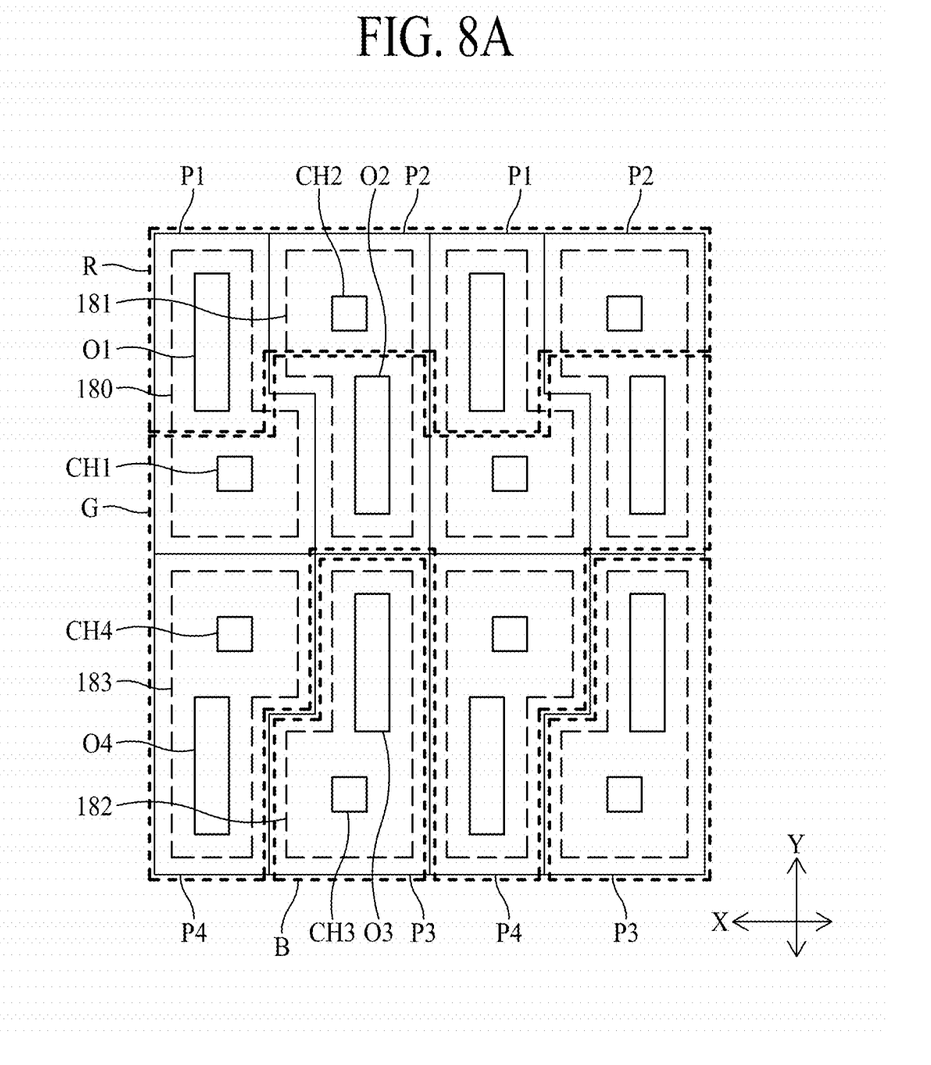
FIGS. 8A and 8B are schematic plan views illustrating an arrangement state of subpixels and color filters in a high-resolution organic light emitting display device according to an embodiment of the present disclosure.
Figure 8B:
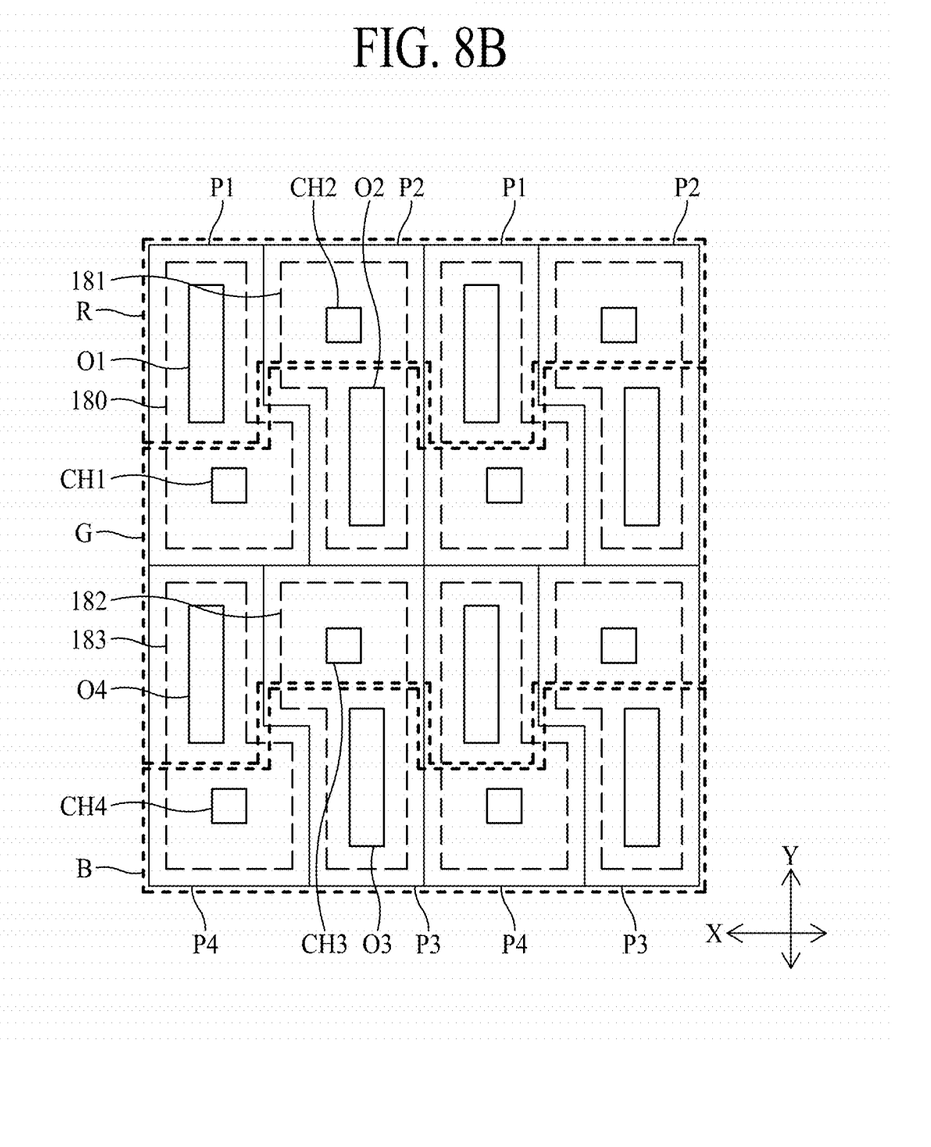

FIGS. 8A and 8B are schematic plan views illustrating an arrangement state of subpixels and color filters in a high-resolution organic light emitting display device according to an embodiment of the present disclosure.

As illustrated in FIG. 8A, a first subpixel P1, a second subpixel P2, a third subpixel P3, and a fourth subpixel P4 may be arranged on a substrate of the organic light emitting display device according to an embodiment of the present disclosure. That is, in the high-resolution organic light emitting display device according to an embodiment of the present disclosure, since an area of one pixel is reduced, the one pixel cannot include all subpixels for emitting red light, green light, and blue light, and thus, two adjacent pixels may include RG subpixels and BG subpixels and may emit lights of RGB colors.

The first subpixel P1 and the second subpixel P2 may be disposed adjacent to each other in a first axis direction (an X axis direction, shown in FIG. 8A), the third subpixel P3 may be disposed adjacent to the second subpixel P2 in a second axis direction (a Y axis direction) vertical to the first axis direction (the X axis direction), and the fourth subpixel P4 may be disposed adjacent to the first subpixel P1 in the second axis direction (the Y axis direction).

The first subpixel P1 may emit light of a first color, the second subpixel P2 and the fourth subpixel P4 may emit light of a second color, and the third subpixel P3 may emit light of a third color. In an embodiment of the present disclosure, an example where the first color is red, the second color is green, and the third color is blue will be described. That is, an RGBG structure where a subpixel for emitting green light which is the most sensitive to eyes of persons is provided as two, a subpixel for emitting red light is provided as one, and a subpixel for emitting blue light is provided as one will be described for example.

As illustrated in FIG. 8A, according to a first embodiment of the present disclosure, the third subpixel P3 and the fourth subpixel P4 may be provided as a line symmetric type with the second subpixel P2 and the first subpixel P1 with respect to a first axis (an X axis). Also, a color filter may be provided on a cathode electrode of each of the subpixels P1 to P4, and in the first embodiment of the present disclosure, a first color filter R, a second color filter G, and a third color filter B may be provided in a pattern illustrated in FIG. 8A.

In this case, the first color filter R may be included in the first subpixel P1 and the second subpixel P2, the second color filter G may be included in the first subpixel P1, the second subpixel P2, and the fourth subpixel P4, and the third color filter B may be included in the third subpixel P3.

In detail, the first color filter R may be provided to overlap a first opening area O1 of the first subpixel P1 and a second contact hole CH2 of the second subpixel P2. Also, the second color filter G may be provided to overlap a first contact hole CH1 of the first subpixel P1, a second opening area O2 of the second subpixel P2, and a fourth contract hole CH4 and a fourth opening area O4 of the fourth subpixel P4. Also, the third color filter B may be provided to overlap a third contract hole CH3 and a third opening area O3 of the third subpixel P3.

That is, as illustrated in FIG. 8A, in the organic light emitting display device according to the first embodiment of the present disclosure, the first color filter R and the second color filter G may be provided as a stripe type which extends along the first axis direction (the X axis direction), thereby solving a problem where color filters are peeled as in the related art organic light emitting display device illustrated in FIG. 3. However, even in this case, since the third color filter B is disposed as an island type, the third color filter B might peel away.

In order to solve such a problem, as illustrated in FIG. 8B, in an organic light emitting display device according to a second embodiment of the present disclosure, the third subpixel P3 and the fourth subpixel P4 may be provided as the same type as that of each of the second subpixel P2 and the first subpixel P1.

In detail, the third subpixel P3 may include the third contact hole CH3 and a third anode electrode 182 which are disposed identically to the second contact hole CH2 and the second anode electrode 181 included in the second subpixel P2. That is, when the third contact hole CH3 and the third anode electrode 182 of the third subpixel P3 are horizontally moved with respect to an X-Y plane, the third contact hole CH3 and the third anode electrode 182 of the third subpixel P3 may fully overlap the second contact hole CH2 and the second anode electrode 181 of the second subpixel P2.

Moreover, the fourth subpixel P4 may include the fourth contact hole CH4 and a fourth anode electrode 183 which are disposed identically to the first contact hole CH1 and the first anode electrode 180 included in the first subpixel P1. That is, when the fourth contact hole CH4 and the fourth anode electrode 183 of the fourth subpixel P4 are horizontally moved with respect to the X-Y plane, the fourth contact hole CH4 and the fourth anode electrode 183 of the fourth subpixel P4 may fully overlap the first contact hole CH1 and the first anode electrode 180 of the first subpixel P1.

In a case where the third subpixel P3 and the fourth subpixel P4 are provided as in the second embodiment of the present disclosure, as illustrated in FIG. 8B, the first color filter R may be included in the first subpixel P1 and the second subpixel P2, the second color filter G may be included in all of the first to fourth subpixels P1 to P4, and the third color filter B may be included in the third subpixel P3 and the fourth subpixel P4, thereby solving a problem where the color filters are peeled when included only one pixel.

In detail, the first color filter R may be provided to overlap the first opening area O1 of the first subpixel P1 and the second contact hole CH2 of the second subpixel P2. Also, the second color filter G may be provided to overlap the contact holes CH1 and CH3 of the first and third subpixels P1 and P3 and the opening areas O2 and O4 of the second and fourth subpixels P2 and P4. Also, the third color filter B may be provided to overlap the third opening area O3 of the third subpixel P3 and the fourth contract hole CH4 of the fourth subpixel P4.

The pixel of FIG. 8B has the structure of RGBGRGBG for the emitting layers. Namely, there are eight light emitting regions in one pixel, two R, four G and two B. In one view, the four G light emitting OLEDs can be considered as one subpixel that has four light emitting regions in the one subpixel. Or, it can be considered as four separate subpixels, all of them G.

That is, as illustrated in FIG. 8B, in the organic light emitting display device according to the second embodiment of the present disclosure, the first color filter R, the second color filter G, and the third color filter B may all be provided as a stripe type which extends along the first axis direction (the X axis direction), thereby solving a problem where color filters are peeled as in the related art organic light emitting display device illustrated in FIG. 3, and reducing or preventing the third color filter B from being peeled in the organic light emitting display device according to the first embodiment of the present disclosure illustrated in FIG. 8A.

As described above, in an embodiment of the present disclosure, the first color filter R, the second color filter G, and the third color filter B may have a stripe type which extends along two or more subpixels, disposed adjacent to each other, of the first to fourth subpixels P1 to P4, thereby solving a problem where color filters are peeled when the first color filter R, the second color filter G, and the third color filter B are provided as an island type.

Moreover, as illustrated in FIG. 8B, the third anode electrode 182 of the third subpixel P3 may have a point symmetric type with the first anode electrode 180 and the fourth anode electrode 183, and the fourth anode electrode 183 of the fourth subpixel P4 may have a point symmetric type with the second anode electrode 181 and the third anode electrode 182. That is, the first to fourth anode electrodes 180 to 183 may be provided to have the same area.

As described above, according to the embodiments of the present disclosure, by using a pixel structure where an anode electrode extends away from, by a certain distance, a contact hole for connecting the anode electrode to a TFT, the partial detachment of the anode electrode is prevented from occurring in the high resolution model.

Moreover, according to the embodiments of the present disclosure, subpixels disposed adjacent to each other may have a point symmetric type so that protruding areas correspond to recessed areas, and thus, the partial detachment of the anode electrode in the high resolution model is prevented even without any change in area of each of subpixels.

Moreover, according to the embodiments of the present disclosure, in the pixel structure of the high resolution model, color filters may be arranged in the stripe type which extends along a plurality of subpixels, thereby reducing or preventing the color filters from being peeled.

Moreover, according to the embodiments of the present disclosure, contact holes and anode electrodes of subpixels disposed vertically adjacent to each other may be identically disposed, and thus, all color filters may be implemented to have the stripe type which extends along a plurality of subpixels.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An organic light emitting display device comprising:
a substrate including a first subpixel and a second subpixel disposed adjacent to each other in a first axis direction;
a first anode electrode provided in the first subpixel and connected to a first thin film transistor (TFT) of the first subpixel through a first contact hole; and
a second anode electrode provided in the second subpixel and connected to a second TFT of the second subpixel through a second contact hole,
wherein
the first contact hole and the second contact hole are disposed in a diagonal direction relative to each other,
the first anode electrode extends away from the first contact hole in a direction toward the second subpixel, and
the second anode electrode extends away from the second contact hole in a direction toward the first subpixel.

2. The organic light emitting display device of claim 1, wherein
the first anode electrode extends away from the first contact hole by at least a first reference distance with respect to the first axis direction, and
the second anode electrode extends away from the second contact hole by at least the first reference distance with respect to the first axis direction.

3. The organic light emitting display device of claim 2, wherein
the first anode electrode extends away from the first contact hole by the first reference distance with respect to a second axis direction vertical to the first axis direction, and
the second anode electrode extends away from the second contact hole by the first reference distance with respect to the second axis direction.

4. The organic light emitting display device of claim 3, further comprising: a bank provided on each of one side and another side of the first anode electrode to expose an upper surface of the first anode electrode, and provided on each of one side and another side of the second anode electrode to expose an upper surface of the second anode electrode.

5. The organic light emitting display device of claim 4, wherein
the first anode electrode extends away from a first opening area, exposed by the bank, of the first anode electrode by a second reference distance, the second anode electrode extends away from a second opening area, exposed by the bank, of the second anode electrode by the second reference distance, and the first reference distance is longer than the second reference distance.

6. The organic light emitting display device of claim 1, wherein in each of the first anode electrode and the second anode electrode, a first length of a longest region is 1.4 or less times a second length of a shortest region with respect to the first axis direction.

7. The organic light emitting display device of claim 1, wherein the first anode electrode and the second anode electrode have a symmetric relationship to each other.

8. The organic light emitting display device of claim 7, wherein the symmetric relationship to each other is a point symmetric relationship.

9. The organic light emitting display device of claim 1, wherein the substrate further comprises:

a third subpixel disposed adjacent to the second subpixel in a second axis direction vertical to the first axis direction; and a fourth subpixel disposed adjacent to the first subpixel in the second axis direction, the first subpixel emits light of a first color, the second subpixel and the fourth subpixel emit light of a second color, and the third subpixel emits light of a third color.

10. The organic light emitting display device of claim 9, further comprising: at least one of a first color filter, a second color filter, and a third color filter having a stripe type which extends along two or more subpixels, disposed adjacent to each other, of the first to fourth subpixels.

11. The organic light emitting display device of claim 10, wherein the first color filter is provided in the first subpixel and the second subpixel, the second color filter is provided in the first subpixel, the second subpixel, the third subpixel, and the fourth subpixel, and the third color filter is provided in the third subpixel and the fourth subpixel.

12. The organic light emitting display device of claim 11, wherein the first color filter is provided to overlap an opening area of the first subpixel and a contact hole of the second subpixel, the second color filter is provided to overlap a contact hole of the first subpixel, a contact hole of the third subpixel, an opening area of the second subpixel, and an opening area of the fourth subpixel, and the third color filter is provided to overlap an opening area of the third subpixel and a contact hole of the fourth subpixel.

13. The organic light emitting display device of claim 9, wherein a second contact hole included in the second subpixel and a third contact hole and a third anode electrode disposed identically to the second anode electrode are provided in the third subpixel, and a first contact hole included in the first subpixel and a fourth contact hole and a fourth anode electrode disposed identically to the first anode electrode are provided in the fourth subpixel.

14. The organic light emitting display device of claim 13, wherein the third anode electrode has a point symmetric type with the first anode electrode and the fourth anode electrode, and the fourth anode electrode has a point symmetric type with the second anode electrode and the third anode electrode.

15. An organic light emitting display device comprising:

a substrate including a first subpixel and a second subpixel disposed adjacent to each other in a first direction;

a first light emitting member positioned within the first subpixel;

a second light emitting member positioned within the second subpixel;

a first anode electrode provided in the first subpixel that is connected to a first thin film transistor of the first subpixel through a first contact hole, the first anode electrode extending in the first direction for a first length at a location adjacent to the first contact hole and the first anode electrode extending in the first direction for a second length at a location adjacent to the first light emitting member; and a second anode electrode provided in the second subpixel that is connected to a second thin film transistor of the second subpixel through a second contact hole, the second anode electrode extending in the first direction for a third length at a location adjacent to the second contact hole and the second anode electrode extending in the first direction for a fourth length at a location adjacent to the second light emitting member.

16. The organic light emitting display device of claim 15 wherein the first length is at least 50% longer than the second length.

17. The organic light emitting display device of claim 15 wherein the first length is twice as long as the second length and the third length is twice as long as the fourth length and the sum of the first and fourth lengths is equal to the sum of the second and third lengths to provide two pixels adjacent to each other having a footprint whose shape is that of a rectangle.

18. The organic light emitting display device of claim 15 wherein the first anode electrode is offset from the first light emitting member a first distance in a direction that is towards the second light emitting member and the second anode electrode is offset from the second light emitting member the first distance in a direction that is towards the first light emitting region.

19. The organic light emitting display device of claim 15 further comprising:

a third subpixel, the third subpixel having a third light emitting member being offset from the first light emitting member in the first direction and being of the same color as the first light emitting member; and a fourth subpixel, the fourth subpixel having a fourth light emitting member being offset from the second light emitting member in the first direction and being of the same color as the second light emitting member.

20. The organic light emitting display device of claim 19 further comprising:

a fifth subpixel, the fifth subpixel having a fifth light emitting member being offset from the first light emitting member in a second direction and being of a different color than the first and the second light emitting members; and a sixth subpixel, the sixth subpixel having a sixth light emitting member being offset from the fifth light emitting member in the first direction and being of the same color as the fifth light emitting member.

* * * * *

UNITED STATES PATENT AND TRADEMARK OFFICE
CERTIFICATE OF CORRECTION

Page 1 of 1

PATENT NO. : 10,211,271 B2
APPLICATION NO. : 15/828216
DATED : February 19, 2019
INVENTOR(S) : JongSung Kim et al.

It is certified that error appears in the above-identified patent and that said Letters Patent is hereby corrected as shown below:

On the Title Page

Add:
--(30) Foreign Application Priority Data
Nov. 30, 2016......(KR)............10-2016-0161912--

Signed and Sealed this
Twenty-second Day of October, 2019

Andrei Iancu
*Director of the United States Patent and Trademark Office*